United States Patent
Sasaoka et al.

(10) Patent No.: US 9,246,073 B2
(45) Date of Patent: Jan. 26, 2016

(54) MOUNTING STRUCTURE, AND METHOD OF MANUFACTURING MOUNTING STRUCTURE

(75) Inventors: Tatsuo Sasaoka, Osaka (JP); Kaori Toyoda, Hyogo (JP); Kentaro Nishiwaki, Osaka (JP); Hiroki Ikeuchi, Osaka (JP); Hiroshi Nasu, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 18 days.

(21) Appl. No.: 13/000,784

(22) PCT Filed: Jun. 18, 2009

(86) PCT No.: PCT/JP2009/002781
§ 371 (c)(1),
(2), (4) Date: Dec. 22, 2010

(87) PCT Pub. No.: WO2009/157160
PCT Pub. Date: Dec. 30, 2009

(65) Prior Publication Data
US 2011/0114706 A1    May 19, 2011

(30) Foreign Application Priority Data
Jun. 25, 2008   (JP) .................. 2008-166565

(51) Int. Cl.
*B23K 31/02*      (2006.01)
*H01L 33/62*      (2010.01)
(Continued)

(52) U.S. Cl.
CPC .............. *H01L 33/62* (2013.01); *B23K 1/0016* (2013.01); *B23K 35/025* (2013.01); *B23K 35/0244* (2013.01); *H01L 24/29* (2013.01);
(Continued)

(58) Field of Classification Search
CPC .......... H01L 2224/73204; H01L 2924/15311; H01L 2924/1665; H01L 2224/48247; H01L 2924/181; H05K 2201/10734; H05K 3/3484; B23K 35/0244; B23K 35/025; B23K 1/0016; B23K 2201/40
USPC ........................................... 228/164
See application file for complete search history.

(56) References Cited

U.S. PATENT DOCUMENTS 5,931,371 A *  8/1999  Pao et al. ................. 228/180.22
7,983,048 B2 *  7/2011  Sasaki et al. ................. 361/719
(Continued)

FOREIGN PATENT DOCUMENTS

EP     09 76 9870      8/2014
JP     5-13820 A       1/1993
(Continued)

OTHER PUBLICATIONS

Machine translation of JP2008-010703, published Jan. 2008.*

*Primary Examiner* — Erin Saad
(74) *Attorney, Agent, or Firm* — RatnerPrestia

(57) ABSTRACT

A mounting structure is provided that can allow gaseous matter generated when performing a heat treatment to escape to outside efficiently. A mounting structure 10 includes a substrate 1 having electrodes 2a and 2b, an electronic component 3 having electrodes 21a and 21b, joints 15a and 15b that electrically connect the electrodes 2a and 2b of the substrate 1 and the electrodes 21a and 21b of the electronic component 3 and also fix the electronic component 3 to the surface of the substrate 1, and a convex portion 4 that abuts against the electrode 2a of the substrate 1 and the electrode 21a of the electronic component 3 and is used as a spacer.

20 Claims, 17 Drawing Sheets

(51) Int. Cl.
*B23K 35/02* (2006.01)
*B23K 1/00* (2006.01)
*H01L 23/00* (2006.01)
*H01L 33/64* (2010.01)
*H05K 3/32* (2006.01)
*H01L 21/56* (2006.01)
*H01L 31/024* (2014.01)
*H05K 3/40* (2006.01)

(52) U.S. Cl.
CPC ............. *H01L 24/32* (2013.01); *H01L 24/83* (2013.01); *H01L 33/641* (2013.01); *H05K 3/321* (2013.01); *H01L 21/563* (2013.01); *H01L 31/024* (2013.01); *H01L 33/647* (2013.01); *H01L 2224/0401* (2013.01); *H01L 2224/06102* (2013.01); *H01L 2224/16225* (2013.01); *H01L 2224/2929* (2013.01); *H01L 2224/29076* (2013.01); *H01L 2224/29339* (2013.01); *H01L 2224/32225* (2013.01); *H01L 2224/48227* (2013.01); *H01L 2224/73204* (2013.01); *H01L 2224/73265* (2013.01); *H01L 2224/838* (2013.01); *H01L 2224/8314* (2013.01); *H01L 2224/83191* (2013.01); *H01L 2224/83192* (2013.01); *H01L 2224/83385* (2013.01); *H01L 2224/83851* (2013.01); *H01L 2924/00011* (2013.01); *H01L 2924/00013* (2013.01); *H01L 2924/01004* (2013.01); *H01L 2924/01005* (2013.01); *H01L 2924/0106* (2013.01); *H01L 2924/01006* (2013.01); *H01L 2924/01013* (2013.01); *H01L 2924/01029* (2013.01); *H01L 2924/0132* (2013.01); *H01L 2924/01033* (2013.01); *H01L 2924/01047* (2013.01); *H01L 2924/01078* (2013.01); *H01L 2924/01079* (2013.01); *H01L 2924/01082* (2013.01); *H01L 2924/0665* (2013.01); *H01L 2924/0781* (2013.01); *H01L 2924/1305* (2013.01); *H01L 2924/13055* (2013.01); *H01L 2924/351* (2013.01); *H05K 3/4007* (2013.01); *H05K 2201/0367* (2013.01); *H05K 2201/10106* (2013.01); *H05K 2201/10166* (2013.01); *H05K 2201/2036* (2013.01); *H05K 2203/1131* (2013.01); *H05K 2203/1178* (2013.01)

(56) References Cited

U.S. PATENT DOCUMENTS

| | | | |
|---|---|---|---|
| 2002/0013015 A1* | 1/2002 | Kado et al. | 438/107 |
| 2002/0146565 A1* | 10/2002 | Ishll et al. | 428/413 |
| 2003/0170444 A1* | 9/2003 | Stewart et al. | 428/317.7 |
| 2005/0110161 A1 | 5/2005 | Naito et al. | |
| 2005/0133808 A1 | 6/2005 | Uraya et al. | |
| 2005/0253159 A1 | 11/2005 | Creswick et al. | |
| 2006/0038304 A1* | 2/2006 | Osako et al. | 257/789 |
| 2006/0192295 A1* | 8/2006 | Lee et al. | 257/778 |
| 2006/0226203 A1* | 10/2006 | Lu et al. | 228/219 |
| 2006/0246627 A1* | 11/2006 | Feustel et al. | 438/118 |
| 2006/0255102 A1* | 11/2006 | Snyder et al. | 228/203 |
| 2007/0001280 A1* | 1/2007 | Hua | 257/686 |

FOREIGN PATENT DOCUMENTS

| | | |
|---|---|---|
| JP | 2005-136399 A | 5/2005 |
| JP | 2006-202586 A | 8/2006 |
| JP | 2007-109833 A | 4/2007 |
| JP | 2007-194383 A | 8/2007 |
| JP | 2007-302953 A | 11/2007 |
| JP | 2008-10703 A | 1/2008 |
| JP | 2008-226946 A | 9/2008 |
| JP | 2009-54893 A | 3/2009 |
| WO | WO 2007/122925 | 11/2007 |
| WO | WO 2008099554 A1 * | 8/2008 |
| WO | 2009/002781 | 9/2009 |

* cited by examiner

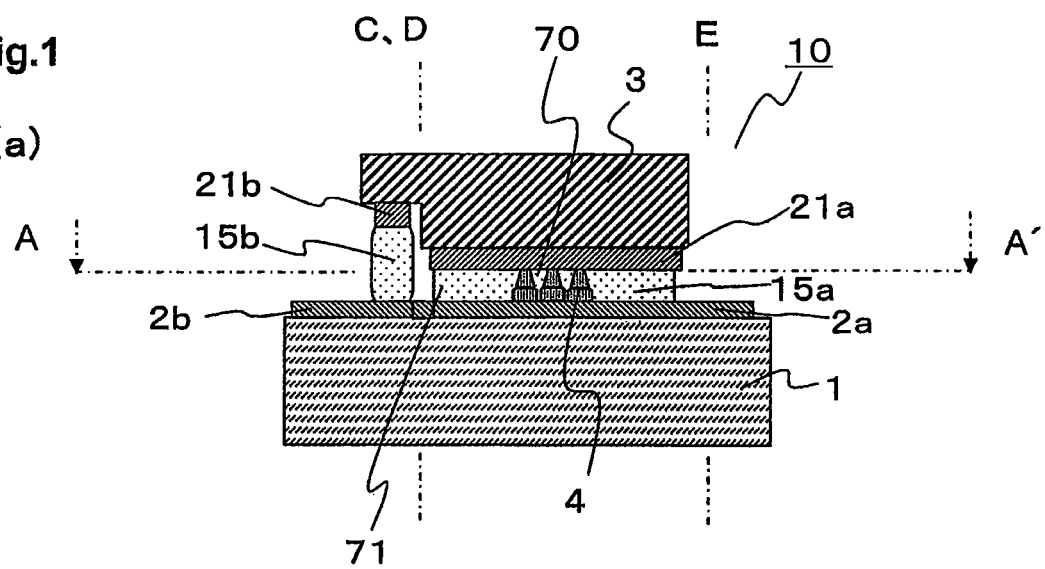
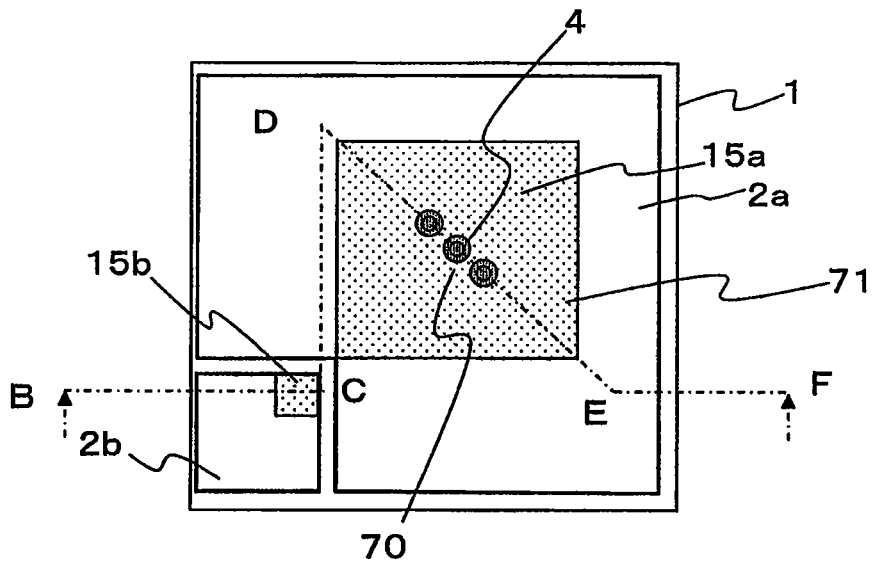
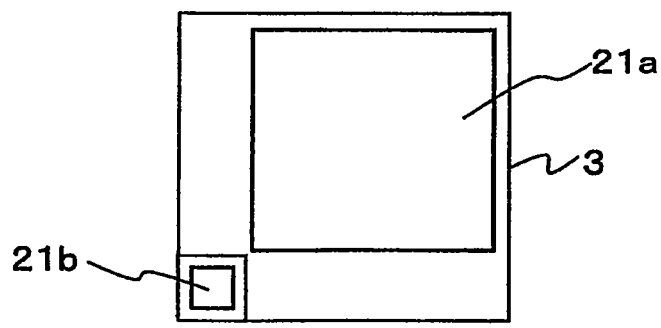

Fig. 2 (a)
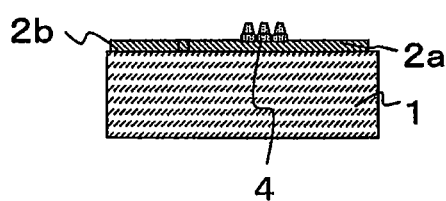
Fig. 2 (b)
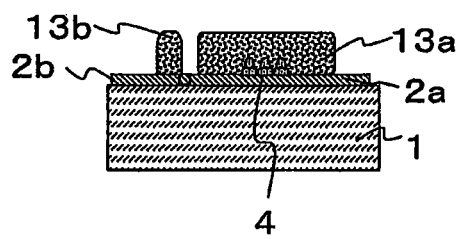
Fig. 2 (c)
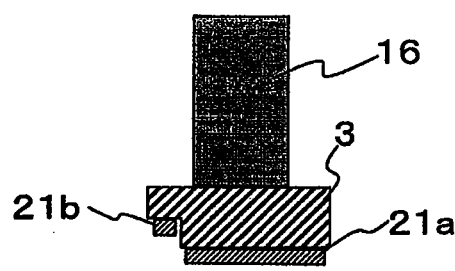
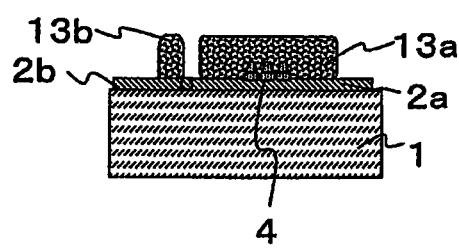
Fig. 2 (d)
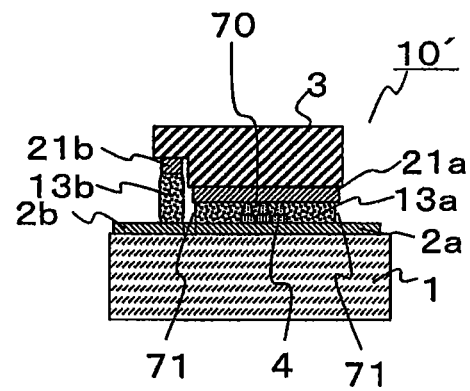
Fig. 2 (e)
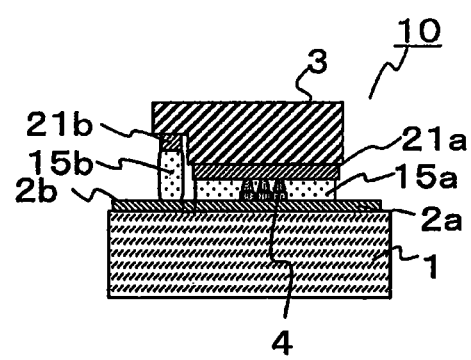

(a)

(b)

Fig.7
(a)
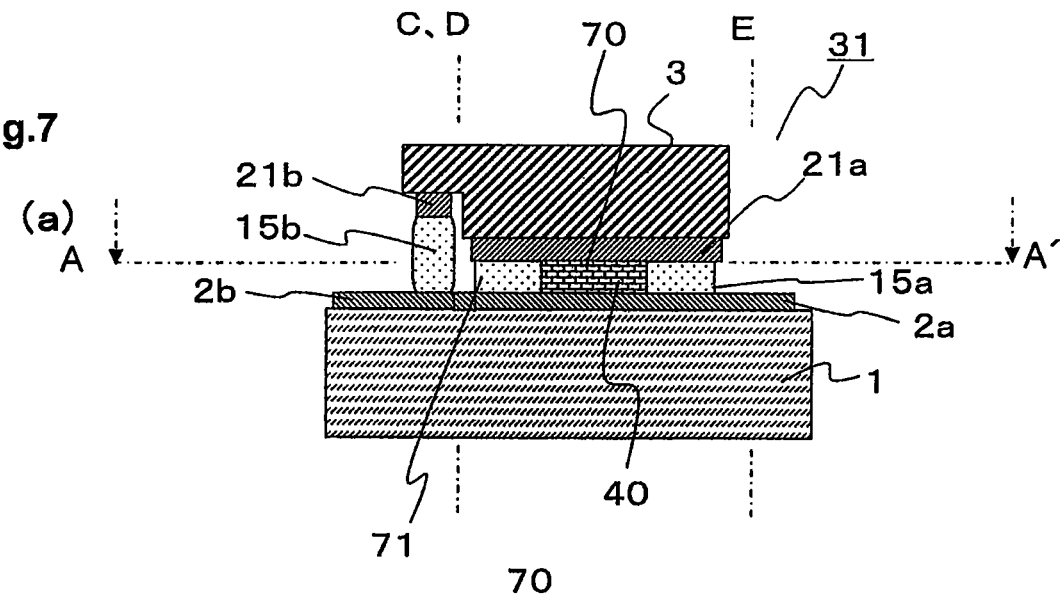
(b)
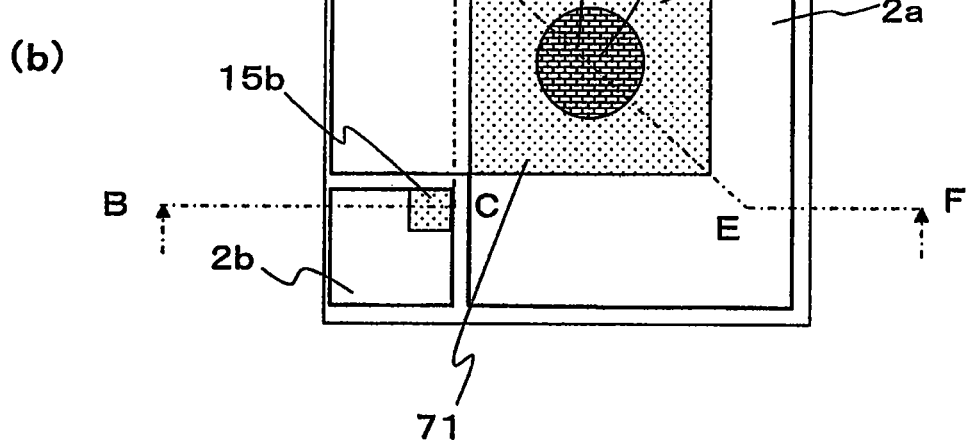

Fig.11 (a)
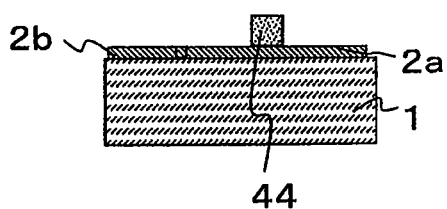
Fig.11 (b)
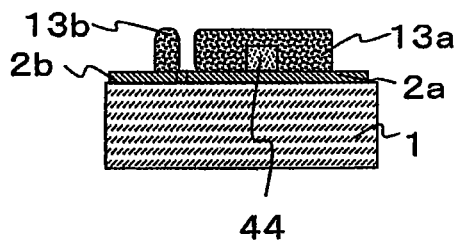
Fig.11 (c)
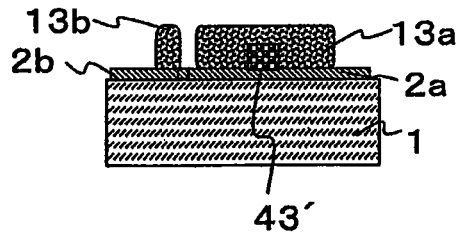
Fig.11 (d)
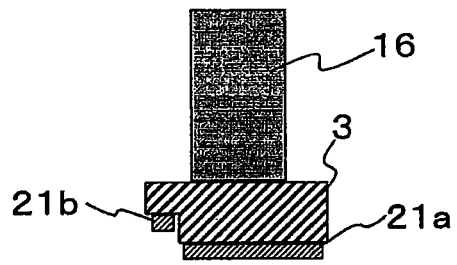
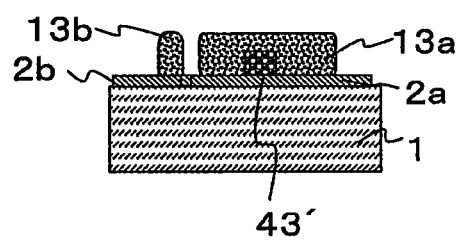
Fig.11 (e)
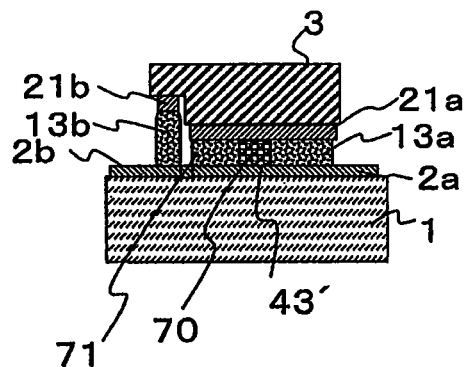
Fig.11 (f)
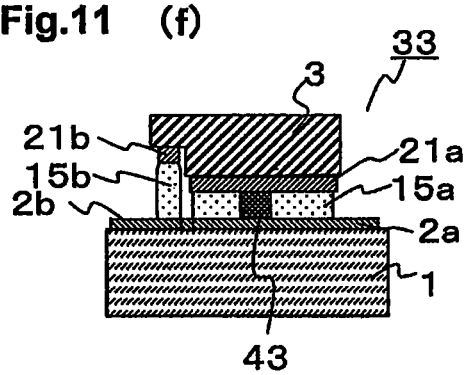

Fig.14 (a)
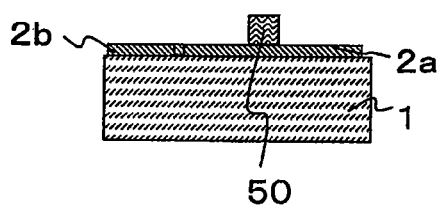
Fig.14 (b)
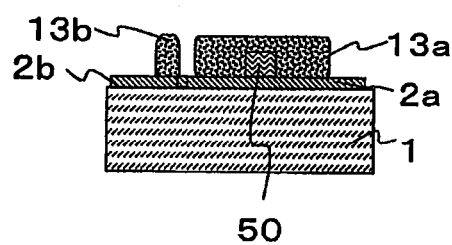
Fig.14 (c)
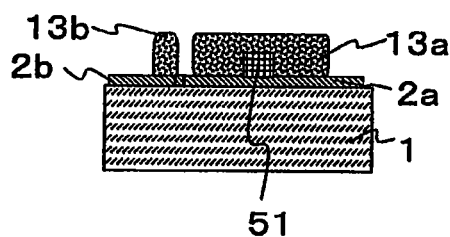
Fig.14 (d)
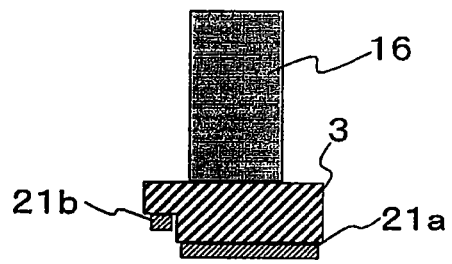
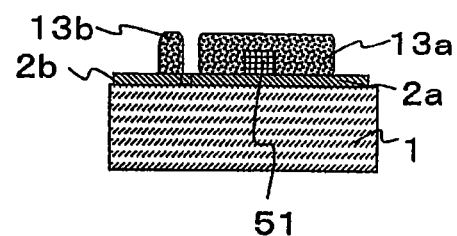
Fig.14 (e)
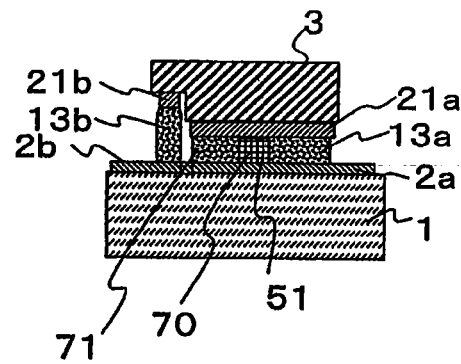
Fig.14 (f)
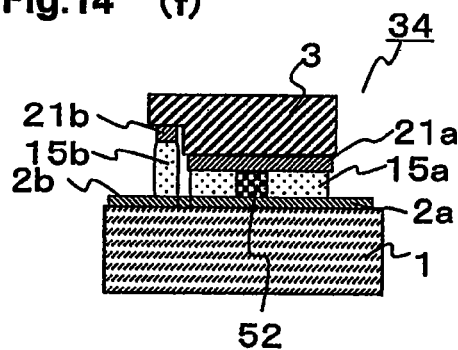

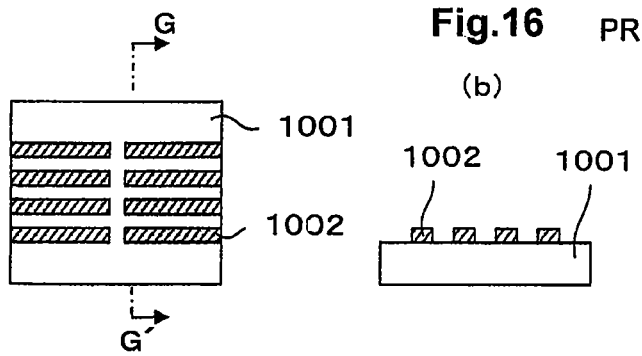
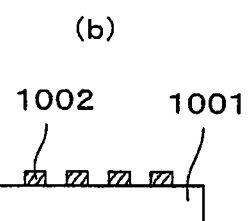
Fig.16 (a) PRIOR ART
Fig.16 (b) PRIOR ART
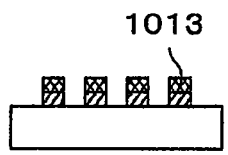
Fig.17 (a) PRIOR ART
Fig.17 (b) PRIOR ART
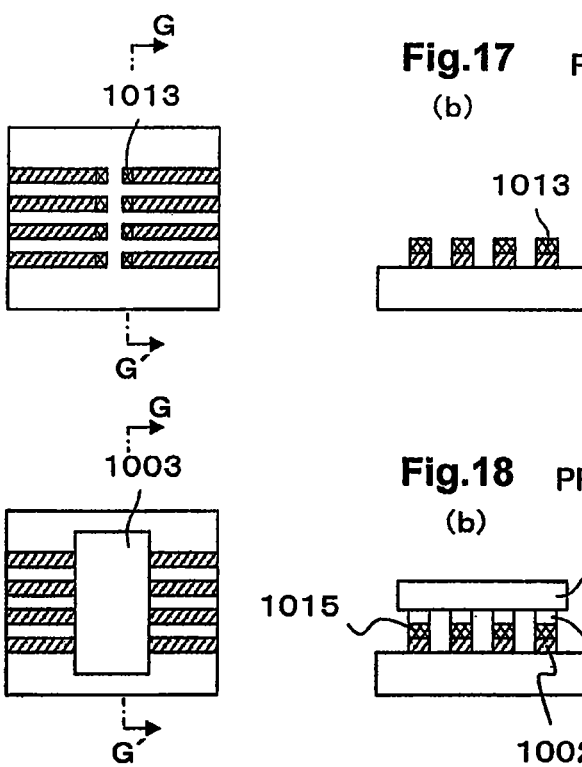
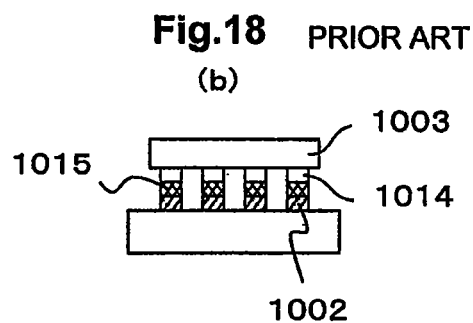
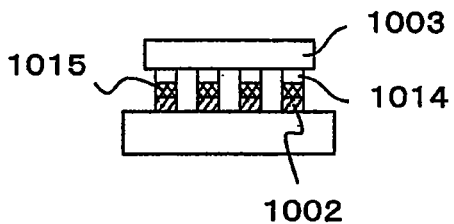
Fig.18 (a) PRIOR ART
Fig.18 (b) PRIOR ART

Fig.19 (a) PRIOR ART
Fig.19 (b) PRIOR ART
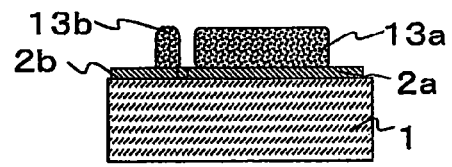
Fig.19 (c) PRIOR ART
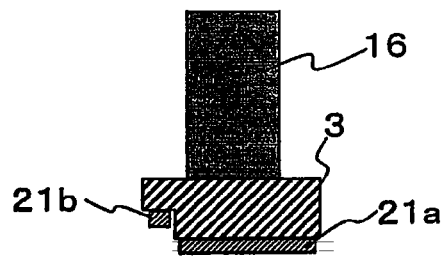
Fig.19 (d) PRIOR ART
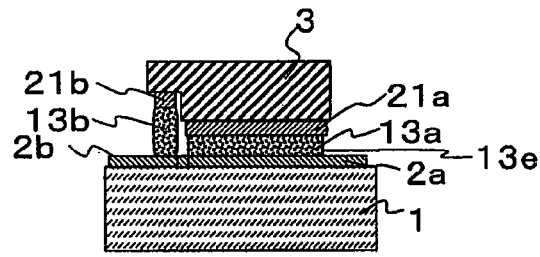
Fig.19 (e) PRIOR ART
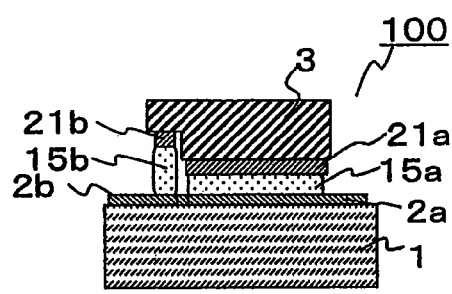
Fig.19 (f) PRIOR ART
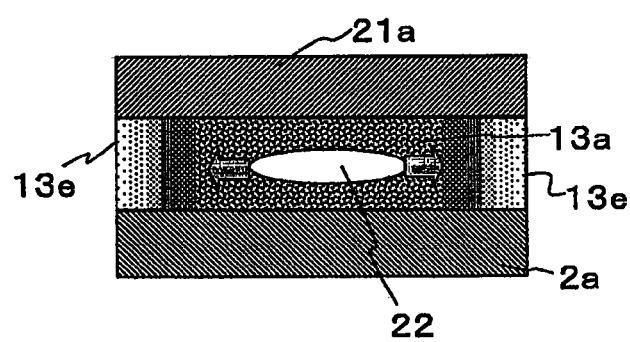

MOUNTING STRUCTURE, AND METHOD OF MANUFACTURING MOUNTING STRUCTURE

This application is a U.S. National Phase Application of PCT International Application PCT/JP2009/002781, filed Jun. 18, 2009, claiming the benefit of priority of Japanese Patent Application No. 2008-166565, filed Jun. 25, 2008, all of which are incorporated by reference herein in their entirety.

TECHNICAL FIELD

The present invention relates to a mounting structure and a method of manufacturing the mounting structure.

BACKGROUND ART

A method in which metal nanoparticles are used as a bonding material is receiving attention as a method of mounting an electronic component such as a semiconductor device on a base material made of ceramic or polyimide or the like. The term "metal nanoparticles" refers to metal particles of a size with a mean particle diameter that is less than 50 nm, such as Au, Ag, or Cu (hereunder, referred to as "metal nanoparticles"). Since the surface activity of such metal nanoparticles is high compared to a bulk material as the result of miniaturization, bonding is possible at a low temperature, and a high fusing point that is equivalent to a bulk material is obtained when bonding occurs and the size increases. Consequently, there are expectations regarding the application of methods that use metal nanoparticles as a bonding material to a wide range of products for which a need exists to decrease thermal stress when mounting electronic components and improve a heat resistant temperature after mounting. Further, compared to a conductive paste material that does not use metal nanoparticles, in a conductive paste material that uses metal nanoparticles, since metal is bonded and not merely touching, the resistivity is low and the bonding strength is also enhanced, and thus superior bonding is achieved. A conventional process of mounting an electronic component using such kind of metal nanoparticles as a bonding material is illustrated in FIGS. 16 to 18.

FIG. 16(a), FIG. 17(a), and FIG. 18(a) are plan views that illustrate a substrate during a mounting step. FIG. 16(b), FIG. 17(b), and FIG. 18(b) are cross-sectional views that represent a section along a line GG' in FIG. 16(a), FIG. 17(a), and FIG. 18(a), respectively.

First, as shown in FIGS. 16(a) and (b), a substrate 1001 is prepared in which conductor wiring 1002 is formed on a base material. Next, as shown in FIGS. 17(a) and (b), a bonding material portion 1013 is formed at component mounting positions on the conductor wiring 1002 using a paste material that includes metal nanoparticles (hereunder, referred to as "metal nanoparticle paste material").

Next, as shown in FIGS. 18(a) and (b), electrodes 1014 of an electronic component 1003 are positioned facing the bonding material portion 1013, and the electronic component 1003 is mounted on the substrate 1001. Further, by applying energy such as heat to the bonding material portion 1013, the bonding material portion 1013 is bonded and cured to form joints 1015, and thereby bond the electrodes 1014 of the electronic component 1003 and the conductor wiring 1002 of the substrate 1001. As a result, as shown in FIGS. 18(a) and (b), a mounting structure is produced in which the electrodes 1014 of the electronic component 1003, the joints 1015, and the conductor wiring 1002 are connected in that order in a layered structure.

The metal nanoparticle paste material is stabilized by means of a dispersing agent to prevent polymerization of the metal nanoparticles. By applying energy such as heat to the metal nanoparticle paste material, the dispersing agent in the bonding material portion 1013 is decomposed using oxygen, so that metal nanoparticles fuse together and bond to form the joint 1015.

A method has been proposed that uses this kind of metal nanoparticle paste material when mounting an LED as an electronic component (for example, see Japanese Patent Laid-Open No. 2005-136399). According to Japanese Patent Laid-Open No. 2005-136399, a metal nanoparticle paste is cured by applying ultrasonic vibrations thereto. However, when using ultrasonic vibrations, in some cases damage is caused to the electronic components or the bonding is insufficient. Hence, a method has also been proposed in which curing is performed by heating in the same way as described above together with the use of ultrasonic vibrations or instead of using ultrasonic vibrations.

SUMMARY OF INVENTION

Problems to be Solved by Invention

However, according to the conventional mounting structure described above, although when the substrate and electrode area of an electronic component is small it is possible for gaseous matter such as gas that is generated when heating the bonding material portion 1013 to escape into the air, when the electrode area is large, there is the problem that gaseous matter such as gas can not escape into the air. This problem is described in detail below.

FIGS. 19(a) to (f) are views that illustrate a method of manufacturing a mounting structure 100 when mounting an LED as an electronic component. When using an LED device as an electronic component, as shown in FIG. 19(a), the substrate electrodes include an electrode 2a and an electrode 2b of different sizes.

As shown in FIG. 19(b), a metal nanoparticle paste material is coated on the electrodes 2a and 2b, to form bonding material portions 13a and 13b.

The electronic component 3 that is an LED has electrodes 21a and 21b that correspond to the electrodes 2a and 2b of a substrate 1. Next, as shown in FIG. 19(c), a face of the electronic component 3 on a side opposite the side on which the electrodes 21a and 21b are formed is held by suction by a mounting tool 16, and the electronic component 3 is placed on the bonding material portions 13a and 13b (FIG. 19(d)). Thereafter, drying and a heat treatment is performed, so that the metal nanoparticle paste material of the bonding material portions 13a and 13b cures to form joints 15a and 15b, and thereby produce the mounting structure 100 (FIG. 19(e)).

Since heat and oxygen are required for decomposition of a dispersing agent when performing heat treatment, it is easier for oxygen to be supplied at the peripheral portion of the bonding material portion rather than from the central portion, because the peripheral portion is touching the external air. As a result, there is a tendency for the curing rate to be faster at the peripheral portion than at the central portion of the bonding material portion. In the case of using a common semiconductor chip as an electronic component, accompanying microfabrication, an electrode thereof is the size of an area of several tens of μm square or less, and the width of the wiring is 100 μm or less. Hence, there is little difference between the curing rate at a peripheral portion and a central portion of the bonding material portion. Consequently, a gas can be allowed to escape from within the metal nanoparticle paste material.

However, since the electrode 21a of the LED is a size of an area of several mm square, as shown in the enlarged view of the bonding material portion 13a shown in FIG. 19(f), a peripheral portion 13e of the bonding material portion 13a is cured first, and thereafter the central portion is cured. Consequently, it is difficult to let a gas 22 that arises in the vicinity of the central portion escape to outside of the bonding material portion 13a. As a result, the gas is liable to remain inside the joint 15 after the heat treatment, and a bonding failure may occur.

Further, when the bonding material portion 13a is made with a thin thickness, the area of a portion at which gas generated at the central portion escapes decreases. Consequently, the gas is more liable to remain after the heat treatment.

The present invention has been made in view of the problems associated with the conventional mounting structure, and an object of the invention is to provide a mounting structure that can efficiently allow gaseous matter that is generated when performing a heat treatment to escape to outside, as well as a method of manufacturing the mounting structure.

Means of Solving Problem

In order to solve the above problem, the $1^{st}$ aspect of the present invention is a mounting structure, comprising:
a substrate;
an electronic component;
a joint which fixes the electronic component to a surface of the substrate, and which is made of a metal nanoparticle paste material; and
a member which abuts against the electronic component and the substrate, and which is used as a spacer.

Furthermore, the $2^{nd}$ aspect of the present invention is the mounting structure according to the $1^{st}$ aspect of the present invention, wherein the member is embedded at a central portion of the joint, and is made of a material with a higher thermal conductivity than the metal nanoparticle paste material.

Furthermore, the $3^{rd}$ aspect of the present invention is the mounting structure according to the $1^{st}$ aspect of the present invention, wherein the member is a member which is embedded at a central portion of the joint, and which has supplied oxygen to the metal nanoparticle paste material.

Furthermore, the $4^{th}$ aspect of the present invention is the mounting structure according to any of the $1^{st}$ to $3^{rd}$ aspects of the present invention, wherein:
the substrate has an electrode;
the electronic component has an electrode;
the joint electrically connects the electrode of the substrate and the electrode of the electronic component; and
the member abuts against the electrode of the electronic component and the electrode of the substrate.

Furthermore, the $5^{th}$ aspect of the present invention is the mounting structure according to the $4^{th}$ aspect of the present invention, wherein the member is formed by unevenness on a surface of the electrode of the substrate or the electrode of the electronic component.

Furthermore, the $6^{th}$ aspect of the present invention is the mounting structure according to the $1^{st}$ aspect of the present invention, wherein the joint has a heat radiation function.

Furthermore, the $7^{th}$ aspect of the present invention is the mounting structure according to any of the $1^{st}$ to $3^{rd}$ aspects of the present invention, wherein:
a plurality of the members are provided; and
the plurality of the members are provided more densely at the central portion than a peripheral portion of the joint.

Furthermore, the $8^{th}$ aspect of the present invention is the mounting structure according to the $4^{th}$ aspect of the present invention, wherein:
the electrode of the substrate and the electrode of the electronic component are provided so as to at least partly face each other; and
the joint is provided at least between portions of the electrodes, which are provided so as to face each other.

Furthermore, the $9^{th}$ aspect of the present invention is the mounting structure according to the $1^{st}$ or $2^{nd}$ aspect of the present invention, wherein the member is formed by a bump.

Furthermore, the $10^{th}$ aspect of the present invention is the mounting structure according to any of any of the $1^{st}$ to $3^{rd}$ aspects of the present invention, wherein the member is made using a paste material which includes a conductive substance.

Furthermore, the $11^{th}$ aspect of the present invention is the mounting structure according to the $3^{rd}$ aspect of the present invention, wherein the member is made using a paste material in which a metal oxide and a resin are mixed.

Furthermore, the $12^{th}$ aspect of the present invention is the mounting structure according to the $3^{rd}$ aspect of the present invention, wherein the member is made using a metal oxide.

Furthermore, the $13^{th}$ aspect of the present invention is the mounting structure according to any of the $1^{st}$ to $3^{rd}$ aspects of the present invention, wherein the member is made of a material with a lower curing temperature than the metal nanoparticle paste material of which the joint is made.

Furthermore, the $14^{th}$ aspect of the present invention is the mounting structure according to any of the $1^{st}$ to $3^{rd}$ aspects of the present invention, wherein the metal nanoparticle paste material includes metal particles of less than 50 nm.

Furthermore, the $15^{th}$ aspect of the present invention is the mounting structure according to the $4^{th}$ aspect of the present invention, wherein a portion of either of the electrode of the substrate and the electrode of the electronic component, which corresponds to the central portion of the joint, is formed of a material which has supplied oxygen to the metal nanoparticle paste material.

Furthermore, the $16^{th}$ aspect of the present invention is a method of manufacturing a mounting structure which comprises:
a substrate;
an electronic component;
a joint which fixes the electronic component to a surface of the substrate, and which is made of a metal nanoparticle paste material; and
a member which is provided, as a spacer which abuts against the electronic component and the substrate, in the joint,
the method comprising:
a member forming step that forms the member which is used as the spacer on the substrate or the electronic component;
a coating step that coats the metal nanoparticle paste material on the substrate or the electronic component;
an arrangement step that arranges the substrate and the electronic component so as to sandwich the metal nanoparticle paste material which is coated; and
a heat treatment step that cures the metal nanoparticle paste material by applying, after the arrangement step, heat to the metal nanoparticle paste material, and that forms the joint.

Furthermore, the $17^{th}$ aspect of the present invention is the method of manufacturing a mounting structure according to the $16^{th}$ aspect of the present invention, wherein:

the member is provided at a central portion of the joint; and
in the heat treatment step, a material of which the member is made increases in temperature faster than the metal nanoparticle paste material.

Furthermore, the 18$^{th}$ aspect of the present invention is the method of manufacturing a mounting structure according to the 16$^{th}$ aspect of the present invention, wherein:
the member is provided at a central portion of the joint; and
in the heat treatment step, the member supplies oxygen to the metal nanoparticle paste material.

Effects of Invention

According to the present invention, a mounting structure can be provided which allows gaseous matter that is generated when performing a heat treatment to escape to outside efficiently, as well as a method of manufacturing the mounting structure.

BRIEF DESCRIPTION OF DRAWINGS

FIG. 1(a) is a cross-sectional configuration diagram of a mounting structure 10 according to Embodiment 1 of the present invention, FIG. 1(b) is a cross-sectional view along a line AA' in FIG. 1(a), and FIG. 1(c) is a back view of an electronic component 3.

FIGS. 2(a) to (e) are views for describing a method of manufacturing the mounting structure 10 of Embodiment 1 according to the present invention.

FIGS. 7(a) and 7(b) are a cross-sectional configuration diagram of a mounting structure 31 that is a modification example of Embodiment 1 according to the present invention.

FIGS. 11(a) to (f) are views for describing a method of manufacturing the mounting structure 33 of Embodiment 2 according to the present invention.

FIGS. 14(a) to (f) are views for describing a method of manufacturing the mounting structure 34 of Embodiment 3 according to the present invention.

FIGS. 16(a) and (b) are views for describing a method of manufacturing a conventional mounting structure.

FIGS. 17(a) and (b) are views for describing a method of manufacturing a conventional mounting structure.

FIGS. 18(a) and (b) are views for describing a method of manufacturing a conventional mounting structure.

FIGS. 19(a) to (f) are views for describing a method of manufacturing a conventional mounting structure.

MODES FOR CARRYING OUT INVENTION

Figure 3:
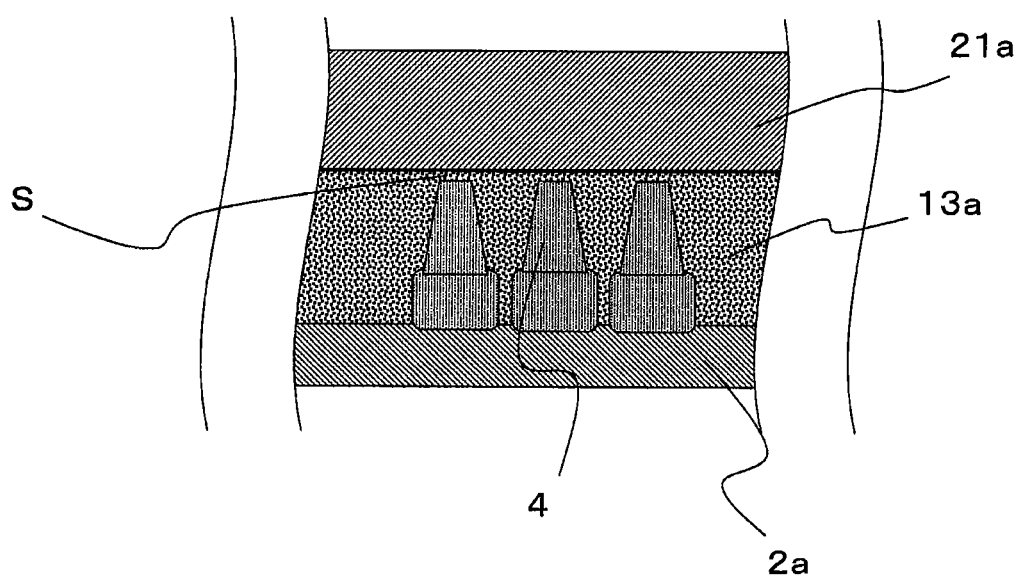
FIG. 3 is a view that illustrates an example of a state in which convex portions on the mounting structure abut against an electrode according to Embodiment 1 of the present invention.

Embodiments of the present invention are described hereunder based on the attached drawings.

Embodiment 1

FIG. 1(a) is a cross-sectional configuration diagram illustrating a mounting structure according to Embodiment 1 of the present invention.

A mounting structure 10 of the present embodiment includes a substrate 1 and an electronic component 3 that is mounted on the surface of the substrate 1. Electrodes 2a and 2b are formed on the surface of the substrate 1. An alumina substrate with favorable heat-radiating properties is used as the substrate 1. The electronic component 3 is an LED that has two electrodes 21a and 21b. The two electrodes 21a and 21b correspond to a p-electrode and an n-electrode.

The electrode 2a and the electrode 21a of the electronic component, and the electrode 2b and the electrode 21b of the electronic component are joined at joints 15a and 15b, respectively. The joints 15a and 15b are created by subjecting a metal nanoparticle paste material to a heat treatment.

A convex portion 4 that corresponds to an example of a member of the present invention is provided in the joint 15a. The convex portion 4 comes in contact with the electrode 2a of the substrate 1 and the electrode 21a of the electronic component 3, and functions as a spacer that maintains a fixed clearance between the electrode 2a of the substrate 1 and the electrode 21a of the electronic component 3 at the time of manufacture.

A material that increases in temperature faster than the metal nanoparticle paste material for producing the joint 15a, more specifically, a material with a high thermal conductivity, is used as the material that forms the convex portion 4.

FIG. 1(b) is a plan view that illustrates the substrate 1, the joints 15a and 15b, and the convex portion 4 of the mounting structure 10. FIG. 1(c) is a plan view that illustrates the electronic component 3 of the mounting structure 10. In this connection, FIG. 1(b) corresponds to a cross-sectional view of the mounting structure 10 at a position along a line AA' shown in FIG. 1(a). The cross-sectional position of FIG. 1(a) is shown by a line BCDEF in FIG. 1(b).

As shown in FIGS. 1(a) to (c), the joint 15a is formed at a portion at which the electrode 2a and the electrode 21a face each other, and the joint 15b is formed at a portion at which the electrode 2b and the electrode 21b face each other. As shown in FIG. 1(b), three convex portions 4 are provided at a central portion 70 of the joint 15a. In the present application, the term "central portion" refers to a portion that includes not only the center, but also an area in the vicinity of the center. Further, in the drawings, reference numeral 71 denotes a peripheral portion of the joint 15a.

Next, a method of manufacturing the mounting structure 10 of the present embodiment is described. FIGS. 2(a) to (e)

are views for describing the method of manufacturing the mounting structure 10 of the present embodiment.

First, as shown in FIG. 2(a), convex portions 4 are formed on the electrode 2a that is formed on the surface of the substrate 1. The electrodes 2a and 2b, and the electrodes 21a and 21b of the electronic component 3 are formed, for example, from gold. The electronic component 3 is, for example, an LED device with a sectional shape that is a 10-mm square area. The convex portions 4 are composed of gold bumps that are made with a wire bonding apparatus. One size of the convex portion 4 is, for example, a diameter of approximately 50 to 80 μm at a lower part and a diameter of approximately 20 to 30 μm at an upper part in FIG. 2, and the height thereof can be 30 μm. A step for forming the convex portion 4 corresponds to one example of a member forming step of the present invention.

Next, as shown in FIG. 2(b), a metal nanoparticle paste material is coated on the electrodes 2a and 2b of the substrate 1 to form the bonding material portions 13a and 13b. The material used as the metal nanoparticle paste material can be one in which, for example, gold microparticles as metal nanoparticles that are conductive components are dispersed in a solvent. The metal nanoparticles are covered by the dispersing agent in the solvent. For example, tetradecane can be used as the solvent. As the dispersing agent, for example, one or more kinds of chemical compounds that have a group capable of coordinated binding with a metallic element such as alkylamine can be used. Further, the metal nanoparticle paste material can include, for example, 50 weight percent of gold microparticles with a mean particle diameter of 3 to 7 nm, and the density of the gold microparticles can be set to 1.6 g/cc. Preferably, the viscosity of the metal nanoparticle paste material is set to 20 to 50 mPa·s. The metal nanoparticle paste material corresponds to one example of a material used for producing a joint of the present invention, and corresponds to an example of the bonding material of the present invention.

For example, an ink jet method or a spin coating method or dye coating method or the like can be used as the coating method. After performing a coating step two or three times so as to envelop the convex portions 4 using the coating method, the bonding material portions 13a and 13b are formed so as to have a comparatively thick thickness. In this connection, the metal nanoparticle paste material has a low viscosity, and therefore coating by an ink jet method can be easily utilized. The step of coating a metal nanoparticle paste material corresponds to an example of a coating step of the present invention.

Thereafter, as shown in FIG. 2(c), the electronic component 3 is held with the mounting tool 16 and placed over the bonding material portions 13a and 13b. Subsequently, as shown in FIG. 2(d), the electronic component 3 is pressed against the bonding material portions 13a and 13b until the electrode 21a abuts against the upper end of the convex portions 4. This step corresponds to one example of an arrangement step of the present invention. In the present specification, the term "abut" refers to a state of resisting a pressing force of the electronic component 3 and includes not only a case in which the convex portions 4 are directly contacting the electrode 21a, but also a case as shown in the partially enlarged view in FIG. 3 in which a small amount of metal nanoparticle paste material remains between the convex portions 4 and the electrode 21a. In this connection, FIG. 3 is a partially enlarged view of FIG. 2(d), in which a portion at which a small amount of metal nanoparticle paste material remains is denoted by reference character S.

Finally, curing of the bonding material portions 13a and 13b is performed by heat treatment to form the joints 15a and 15b, and thereby produce the mounting structure 10 shown in FIG. 2(e). The conditions for curing include inserting a mounting structure 10' in the state shown in FIG. 2(d) into a hot air circulating oven and, for example, increasing the temperature to 100° C. at a rate of temperature increase of 5° C./min, and thereafter maintaining the temperature at 100° C. for 10 minutes. This step corresponds to one example of a heat treatment step of the present invention.

According to the present embodiment, when placing the electronic component 3 on the bonding material portions 13a and 13b, the convex portions 4 function as spacers and thus a constant clearance can be maintained between the electrode 2a and the electrode 21a of the electronic component. Consequently, when performing the heat treatment, it is possible for gas that is generated by heating a dispersing agent component in the bonding material portion 13a to escape to outside from the peripheral portion 71 (see FIG. 2(d)) of the bonding material portion 13a.

For example, if a case is assumed in which the convex portions 4 are not present, when placing the electronic component 3 on the bonding material portions 13a and 13b, the electrode 2a and the electrode 21a of the electronic component will come closer than necessary to each other due to the flexibility of the metal nanoparticle paste material, and hence the thickness of the mounting structure will become thin and it will be difficult for gas to escape to outside from the peripheral portion 13e of the bonding material portion 13a. Therefore, air cavities may form in the joint 15a after heat treatment and the bonding strength between the substrate 1 and the electronic component 3 will weaken. Further, the joint may become unstable due to the effect of residual gas when operating the electronic component 3.

In contrast, by providing the convex portions 4 that function as spacers as in the present embodiment, the electrode 2a of the substrate 1 and the electrode 21a of the electronic component 3 do not come closer to each other than necessary. It is thus possible to suppress the occurrence of a short circuit caused by the metal nanoparticle paste material that forms the bonding material portion 13a between the electrode 2a and the electrode 21a being pushed out from between the electrodes and contacting the neighboring electrodes 2b and 21b and the metal nanoparticle paste material between the electrodes 2b and 21b. In this connection, pushing out of the metal nanoparticle paste material of the bonding material portion 13b on the electrode 2b and 21b side is also suppressed.

Since convex portions 4 are provided at the central portion 70 of the bonding material portion 13a, there is less metal nanoparticle paste material present at the central portion 70 and thus the occurrence of gas can itself be suppressed.

Further, according to the present embodiment, since the convex portions 4 are formed by metal bumps whose temperature rises faster than the temperature of the metal nanoparticle paste material, the convex portions 4 increase in temperature faster than the bonding material portions 13a and 13b during the heat treatment. Consequently, when performing the heat treatment, curing of the metal nanoparticle paste material begins from the metal nanoparticle paste material that is positioned at the central portion 70 and that surrounds the convex portions 4, and gaseous matter such as gas is generated accompanying the start of sintering, and heat is gradually conveyed to the peripheral portion 71 from the central portion 70 and sintering and gas generation occur. Hence, the generated gas can escape efficiently to the outside from the peripheral portion 71 of the bonding material portion 13a.

According to the present embodiment, each convex portion 4 is used as a spacer to secure a clearance of a fixed amount between the electrode 2a and electrode 21a. Furthermore, the convex portions 4 are provided as the starting point of gas generation by heat transfer. As a result, it is possible to control the period and location of gas generation, and gas can be allowed to escape to the peripheral portion 71 efficiently from the central portion 70 of the bonding material portion during the heat treatment, so that the joint can be made more reliable.

In comparison to the mounting structure 10 of the present embodiment, in a mounting structure that is made without forming convex portions 4, bubbles remain in the bonding material portion 13a and connection failures and the like occur.

In this connection, a configuration may also be adopted in which the convex portion 4 is used only as a spacer and is not used as a starting point of gas generation by heat transfer. In this case, a material (material with a high thermal conductivity) that undergoes a temperature increase faster than the metal nanoparticle paste material need not be used as the material that forms the convex portion 4.

Figure 4:
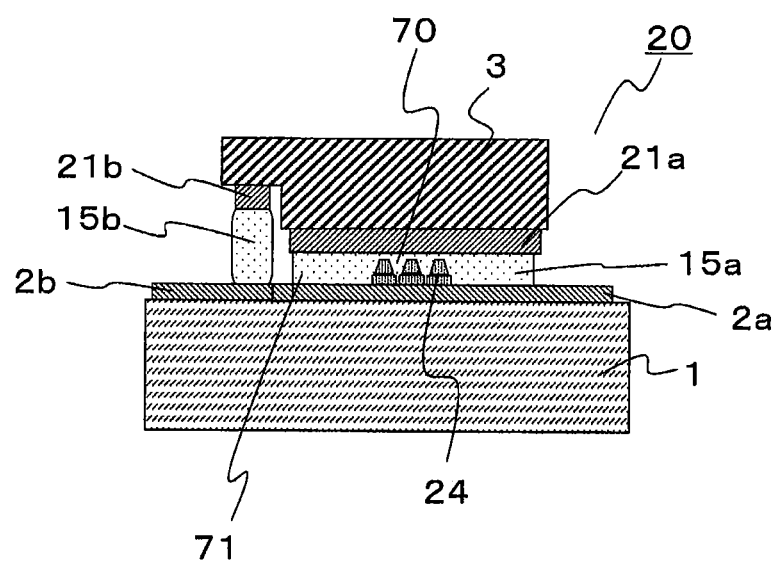
FIG. 4 is a cross-sectional configuration diagram of a mounting structure 20 that is a modification example of Embodiment 1 according to the present invention.

Further, a configuration may be adopted in which the convex portion 4 is used only as a starting point of gas generation by heat transfer, and is not used as a spacer. In this case, it is not necessary for the convex portion 4 to contact both the electrode 2a and the electrode 21a, and it is sufficient that the convex portion 4 contacts at least either one of the electrode 2a and the electrode 21a and that heat is transferred. An example of a mounting structure in this case is shown in FIG. 4. FIG. 4 is a cross-sectional configuration diagram of a mounting structure 20. In this connection, components that are substantially the same as components of the mounting structure 10 are denoted by the same reference numbers. The same applies with respect to the drawings described hereunder.

In the mounting structure 20, three convex portions 24 that touch the electrode 2a are formed at the central portion 70 of the joint 15a. The convex portions 24 are not in contact with the electrode 21a of the electronic component 3, and do not function as spacers that maintain a clearance between the electrode 2a and the electrode 21a.

The convex portions 24 of the mounting structure 20 having this structure increase in temperature faster than the metal nanoparticle paste material, similarly to the present embodiment, and are formed using a material such as gold bumps. Hence, when performing a heat treatment, curing of the metal nanoparticle paste material begins with the convex portions 24 as a starting point, and in accompaniment therewith a gas is generated. The gas can escape from the peripheral portion 71 when the bonding material portion (state before hardening of the joint 15a) is being cured.

Further, because the convex portions 24 do not contact the electrode 21a of the electronic component 3, physical damage to the electronic component 3 at the time of manufacture can be decreased. However, if the height of the convex portions 24 is too low, the proportion of the central portion 70 occupied by the convex portions 24 decreases and the proportion of the central portion 70 occupied by the metal nanoparticle paste material increases, and as a result the amount of gas generated in the central portion 70 will increase. Consequently, it is more preferable to make the height of the convex portions 24 as high as possible.

Although the convex portions 4 are provided at the central portion 70 of the joint 15a according to Embodiment 1, in a case where the convex portions 4 are only used as spacers and are not used as the starting point of gas generation by heat transfer, the convex portions 4 may be provided at the peripheral portion 71 and not at the central portion 70 of the joint 15a.

Figure 5:
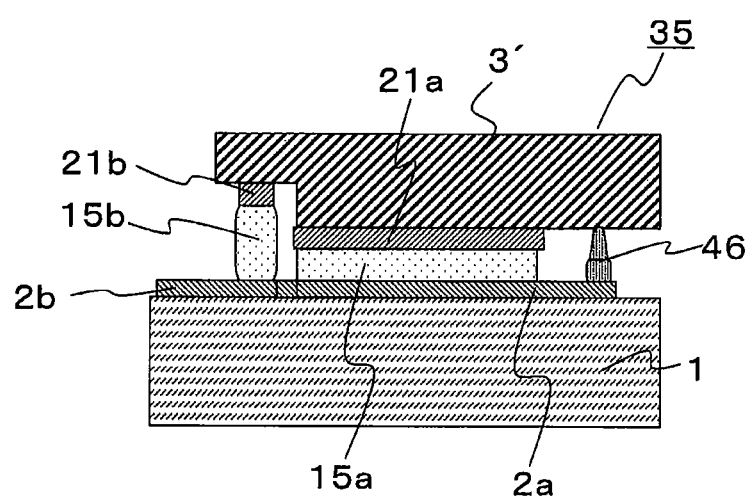
FIG. 5 is a cross-sectional configuration diagram of a mounting structure 35 that is a modification example of Embodiment 1 according to the present invention.

Furthermore, the convex portion may be provided outside the joint 15a and not inside the joint 15a, as shown in the cross-sectional configuration diagram of a mounting structure 35 shown in FIG. 5. In the mounting structure 35 shown in FIG. 5, a convex portion 46 is provided outside the joint 15a. The convex portion 46 is provided on the electrode 2a, and the upper end of the convex portion 46 contacts an electronic component 3'. With this configuration also, the convex portion 46 functions as a spacer, and since a fixed clearance can be maintained between the electrode 21a and the electrode 2a, a gas that is generated when performing a heat treatment can be allowed to escape efficiently to outside. In this connection, the convex portion 46 may also be provided directly on the substrate 1 rather than on the electrode 2a.

However, a configuration in which the convex portion 4 is provided at the central portion 70 of the joint 15a is more preferable since is it possible to suppress the generation of gas itself, because the amount of metal nanoparticle paste material at the central portion 70 is decreased.

Although according to the above described embodiment the rate of temperature increase is set to, for example, 5° C./min, the rate of temperature increase may be appropriately changed depending on the components included in the metal nanoparticle paste material. However, if the rate of temperature increase is too fast, bumping of the solvent in the bonding material portion will occur, and bubbles will be unable to escape smoothly from between the electrode 21a of the electronic component and the electrode 2a of the substrate.

According to the present embodiment, as shown in FIG. 2(b), since metal bumps are used as the convex portions 4 and the metal bumps have a high thermal conductivity, heat of the electronic component 3 is easily transferred to the substrate 1. The metal bumps can be prepared by plating or wire bonding or the like. Further, since the metal bumps have pointed tips, an increasing amount of space can be created towards the upper part of the bumps, and it is easy for the generated gas to escape to outside.

In this connection, although the convex portions 4 can also be formed on the electronic component 3 side rather than the substrate 1 side, in such case the convex portions 4 may cause physical damage to the electronic component 3. It is therefore preferable to provide the convex portions 4 on the substrate 1 side. In particular, if the electronic component 3 is a semiconductor, because the structure is one that is weak with respect to physical impact due to microfabrication of internal wiring rules, it is advantageous to provide the convex portions 4 on the substrate 1 side.

Although according to the present embodiment the metal nanoparticle paste material is coated on the side of the substrate 1 on which the convex portions 4 are formed, the metal nanoparticle paste material may be coated on the electronic component 3.

Further, according to the present embodiment, although the structure is one that has a portion in which the electrodes 2a and 2b and the electrodes 21a and 21b are facing each other, respectively, a structure may be adopted in which the electrodes 2a and 2b and the electrodes 21a and 21b do not face each other at all. Furthermore, although in the present embodiment the joint 15 is formed only on an electrode, the joint 15 may be formed across a portion on which an electrode is not provided. More specifically, it is sufficient that a connection portion is formed so that an electrode of the substrate and an electrode of the electronic component are electrically connected and the electronic component can be fixed on the surface of the substrate.

Figure 6:
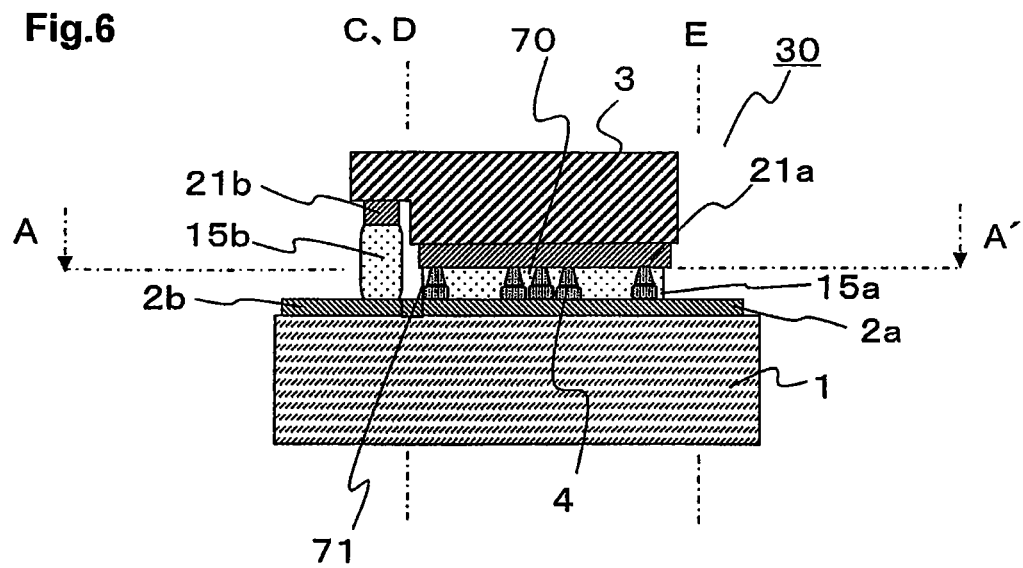
FIG. 6(a) is a cross-sectional configuration diagram of a mounting structure 31 that is a modification example of Embodiment 1 according to the present invention.
FIG. 6(b) is a cross-sectional view along a line AA' in FIG. 6(a).
Figure 6:
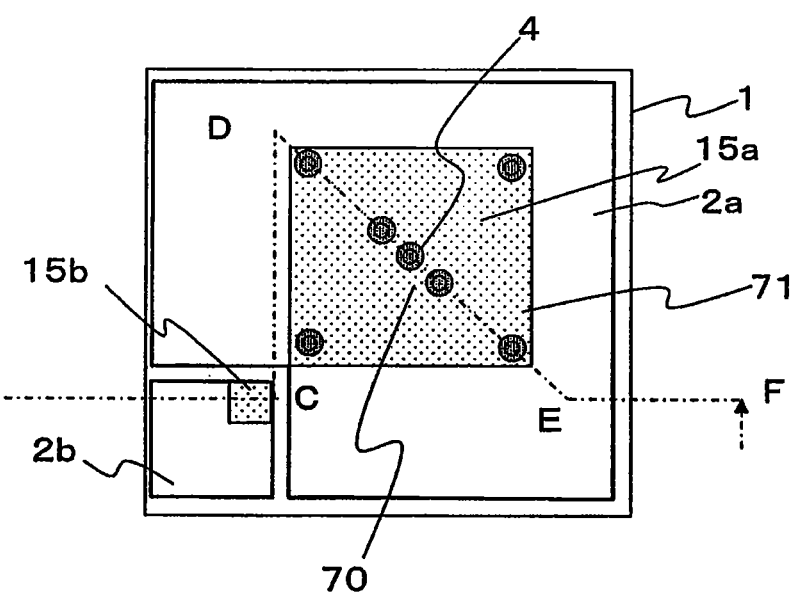

Although according to the present embodiment three convex portions 4 are formed at the central portion 70 of the bonding material portion 13a, the present invention is not limited thereto. For example, a configuration may be adopted as illustrated in a mounting structure 30 in FIG. 6(a) and FIG. 6(b). FIG. 6(a) is a cross-sectional configuration diagram of the mounting structure 30. FIG. 6(b) is a cross-sectional view along a line AA' in (a). The cross-sectional position of FIG. 6(a) is shown by a line BCDEF in FIG. 6(b). In comparison to the mounting structure 10 of the present embodiment, in the mounting structure 30, convex portions 4 comprising a metal bump are also formed at four corners at the peripheral portion 71 of the joint 15. According to the mounting structure 30, a plurality of convex portions 4 are provided more densely at the central portion 70 of the joint 15 that at the peripheral portion 71. By arranging the convex portions 4 in this manner, a clearance between the electrodes can be secured with greater stability, and it is possible for gas to escape to outside from the central portion 70 from which it is hardest for the gas to escape. Further, since the temperature of the bonding material portion 13a increases faster at the central portion 70 than at the peripheral portion 71 due to the difference in the density of the convex portions 4, gas generated at the central portion 70 can be allowed to escape to outside efficiently, and the occurrence of air cavities in the joint 15 can be suppressed. In this connection, the bumps are the same as those described in the above described embodiment.

The number of convex portions 4 is not limited to the structure of the present embodiment, and only one convex portion 4 may be provided at the central portion 70 of the joint 15. However, arranging a further number of convex portions 4 at the periphery of the joint 15 is more preferable because the clearance between the electrode 2a and the electronic component electrode 21a can be maintained fixed overall, and gas can escape easily.

Figure 8:
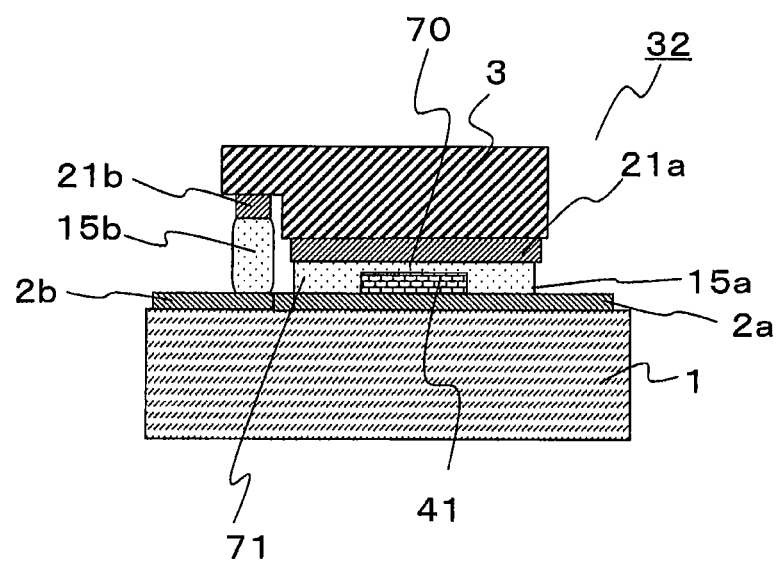
FIG. 8 is a cross-sectional configuration diagram of a mounting structure 32 that is a modification example of Embodiment 1 according to the present invention.

The size of the convex portion 4 of the present embodiment is also not limited, and one large convex portion may be provided at the central portion 70 of the bonding material portion 13a. FIG. 7(a) is a cross-sectional configuration diagram of a mounting structure 31, and FIG. 7(b) is a cross-sectional view along a line AA' in FIG. 7(a). The cross-sectional position of FIG. 7(a) is shown by a line BCDEF in FIG. 7(b). In the mounting structure 31, a single large convex portion 40 is formed at the central portion 70 of the joint 15a. By means of this large convex portion 40, the parallelism between the electrode 2a and the electrode 21a of the electronic component is regulated and a fixed clearance is also secured therebetween, and gas generated during curing of the bonding material portion can be allowed to escape. The convex portion 40 can be made by plating. Further, it is necessary to make the upper surface of the convex portion 40 flat. Although the convex portion 40 in the mounting structure 31 shown in FIG. 7 is used as a spacer that maintains a clearance between the electrode 2a and the electrode 21a and as a starting point of gas generation by heat transfer, when using the convex portion 40 only as a starting point of gas generation by heat transfer, the convex portion 40 need not contact with the electrode 21a. A cross-sectional view of the mounting structure 32 in this state is shown in FIG. 8. A convex portion 41 that does not contact with the electrode 21a is also shown. The cross-sectional position of FIG. 8(a) is the same position as in FIG. 7(a).

In the case of the mounting structures 10, 20, 30 to 32, and 35, it is necessary to manufacture the convex portions in conformity with the respective shapes. Further, in the case of the mounting structures 31 and 32, the convex portions are manufactured by plating.

Figure 9:
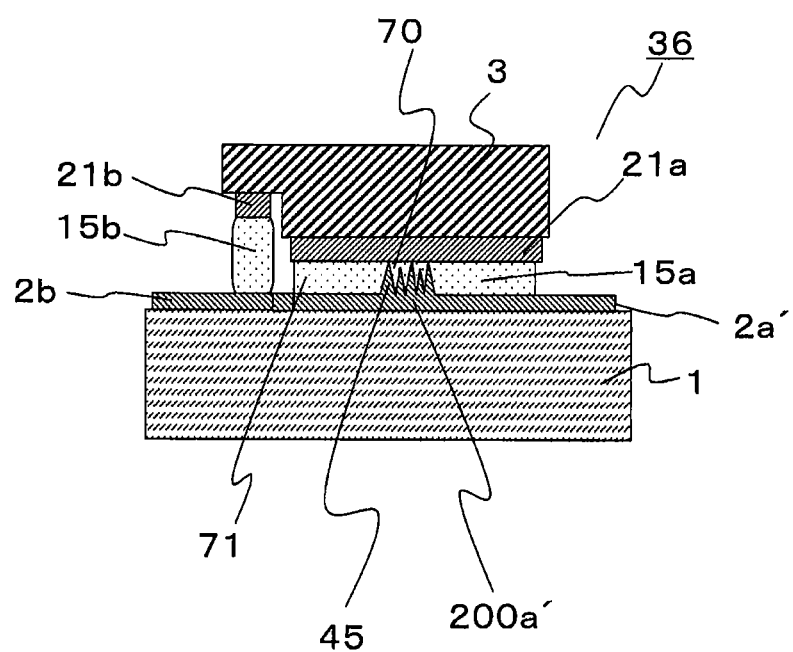
FIG. 9 is a cross-sectional configuration diagram of a mounting structure 36 that is a modification example of Embodiment 1 according to the present invention.

Although according to the mounting structure 10 of Embodiment 1 a convex portion is formed by a metal bump, a convex portion may be formed by fabricating a portion 200a' corresponding to the central portion 70 of the joint 15 of the surface of the electrode 2a in a concavo-convex shape. FIG. 9 is a cross-sectional configuration diagram of a mounting structure 36. In the mounting structure 36 shown in FIG. 9, instead of the electrode 2a of the substrate 1 described above, an electrode 2a' is provided in which unevenness is formed at the central portion 70. A convex portion 45 is composed by the unevenness. The convex portion 45 is formed by first performing fabrication to decrease the thickness of portions other than the portion 200a' of the electrode 2a'. Cutting or grinding or the like is used for the fabrication operation. Next, portions other than the portion 200a' of the electrode 2a' are masked, and a concavo-convex shape can be formed at the portion 200a' by a sandblast process or the like.

Further, since the electrode 2a' is formed from, for example, gold, the thermal conductivity thereof is better than that of the metal nanoparticle paste material. Consequently, the convex portion 45 composed of unevenness of the electrode 2a' can be used as a starting point of gas generation by heat transfer, and curing of metal nanoparticle paste material at the periphery of the convex portion 45 provided at the central portion 70 can be promoted. When using the convex portion 45 only as a spacer, the convex portion 45 need not be formed at the central portion 70.

Further, although the convex portion 45 is formed by processing the surface of the electrode 2a' of the substrate 1 as shown in FIG. 9, the convex portion may be formed by processing the surface of a substrate 21a of the electronic component 3.

Embodiment 2

Next, Embodiment 2 of the present invention is described.

Figure 10:
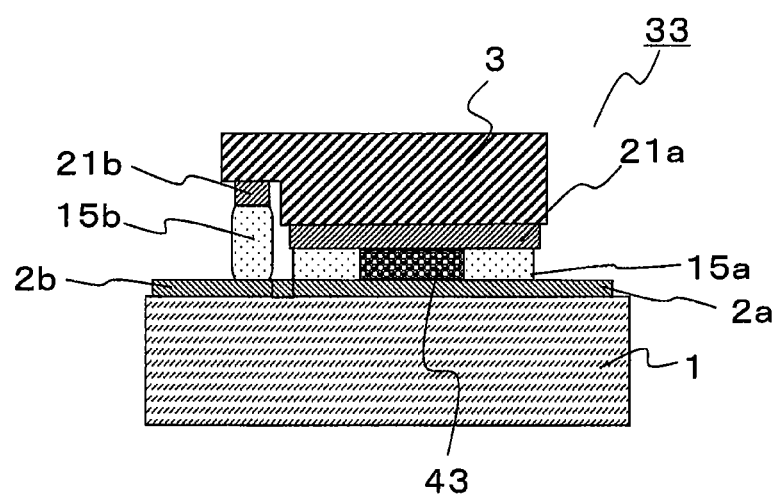
FIG. 10 is a cross-sectional configuration diagram of a mounting structure 33 according to Embodiment 2 of the present invention.

FIG. 10 is a cross-sectional configuration diagram of a mounting structure 33 according to Embodiment 2 of the present invention. As shown in FIG. 10, the mounting structure 33 of Embodiment 2 differs from that of Embodiment 1 in the respect that a single convex portion 43 formed of a conductive paste material is provided at the center of the joint 15. In this connection, components that are substantially the same as components in Embodiment 1 are denoted by the same reference numbers. FIG. 10 is a cross-sectional view at the same position as in FIG. 1(a). The convex portion 43 corresponds to an example of a member of the present invention.

Next, the method of manufacturing the mounting structure 33 according to Embodiment 2 is described.

FIGS. 11(a) to (f) are cross-sectional configuration diagrams for describing a method of manufacturing the mounting structure 33.

First, as shown in FIG. 11(a), a conductive paste material portion 44 at which a conductive paste material is coated on the upper surface of the electrode 2a of the substrate 1 is formed. The conductive paste material corresponds to one example of a paste material including a conductive substance of the present invention. The conductive paste material is, for example, a silver paste material that includes silver, resin, and a curing agent, and a material is used that has a curing temperature that is equal to or less than the curing temperature of the metal nanoparticle paste material. It is not necessary for the conductive paste material to include metal particles with a mean particle diameter of 50 μm or less, as in the metal nanoparticle paste material.

Next, as shown in FIG. 11(b), the metal nanoparticle paste material is coated on the electrodes 2a and 2b so as to cover the conductive paste material portion 44 and form the bonding material portions 13a and 13b. The step of coating the metal nanoparticle paste material to form the bonding material portions 13a and 13b corresponds to an example of a coating step of the present invention.

Thereafter, by heating at a temperature at which the conductive paste material partially cures that is a temperature that is less than the curing temperature of the metal nanoparticle paste material, as shown in FIG. 11(c), only the conductive paste material portion 44 partially cures to form a convex portion 43'. The step of coating and curing the conductive paste material to form the convex portions 43' corresponds to an example of a member forming step of the present invention.

Next, as shown in FIG. 11(d), the electronic component 3 is held with the mounting tool 16 and placed over the bonding material portions 13a and 13b. Subsequently, the electronic component 3 is pressed against the bonding material portions 13a and 13b until the electrode 21a abuts against the upper end of the convex portion 43 (see FIG. 11(e)). This step corresponds to an example of an arrangement step of the present invention.

Finally, curing of the convex portion 43' that is in a partially cured state and the bonding material portions 13a and 13b is performed by a heat treatment in a hot air circulating oven to form the joints 15a and 15b, and thereby produce the mounting structure 33 shown in FIG. 11(f). This step corresponds to one example of a heat treatment step of the present invention. By means of this heat treatment, the convex portion 43' in a partially cured state is cured prior to the bonding material portions 13a and 13b to form the convex portion 43.

Thus, the conductive paste material portion 44 is cured to form the convex portion 43 prior to curing of the bonding material portions 13a and 13b, and the convex portion 43 is used as a spacer that maintains a clearance between the electrode 2a and the electrode 21a of the electronic component 3. It is thereby possible to allow gas that is generated from the bonding material portion 13a to escape efficiently to the outside during the heat treatment step.

Further, since the convex portion 43 is provided at the central portion 70 of the bonding material portion 13a, the amount of metal nanoparticle paste material present at the central portion 70 is decreased and generation of gas can itself be suppressed.

The material used to produce the convex portion 43 is a conductive paste material that, in a partially cured state, increases in temperature faster than the metal nanoparticle paste material that is the material of the bonding material portions 13a and 13b. As a result, the convex portion serves as a starting point of gas generation by heat transfer, and because curing starts from the central portion 70 of the bonding material portion 13a, the gas can be allowed to escape efficiently to the outside.

In this connection, temperatures that are appropriately adjusted can be used for the partial curing temperature and the curing temperature of the conductive paste material that is the material used to produce the convex portion as well as the curing temperature of the metal nanoparticle paste material. Further, it is more preferable to set a difference between the curing temperature of the conductive paste material and the metal nanoparticle paste material to 5° C. or more, on the basis of at least a rate of temperature increase of 5° C./minute. This is because a 5° C. difference between the curing temperatures means that the conductive paste material cures faster than the metal nanoparticle paste material by a period of approximately one minute, and it is thus possible to prevent adverse effects on the curing of the conductive paste material that are caused by gas that is generated when curing the metal nanoparticle paste material.

The convex portion 43' is flexible since it is in a partially cured state when the electrode 21a is pressed thereon. Consequently, as shown in FIG. 11(e), damage to the electrode 21a can be reduced as much as possible when pressing the electronic component 3 against the convex portions 43'.

When using the convex portion 43 as a starting point of gas generation by heat transfer and not using the convex portion 43 as a spacer for securing a clearance between electrodes, curing of the conductive paste material portion 44 may be performed before curing the bonding material portions 13a and 13b, or may be performed at the same time as curing the bonding material portions 13a and 13b.

Figure 12:
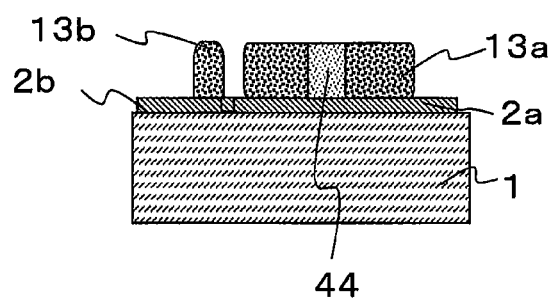
FIG. 12 is a view for describing a modification example of a method of manufacturing the mounting structure 33 of Embodiment 2 according to the present invention.

Further, the metal nanoparticle paste material need not be coated so as to cover the conductive paste material portion 44 as shown in FIG. 11(b). Instead, as shown in FIG. 12, the bonding material portion 13a may be formed in a manner that avoids the conductive paste material portion 44.

Although according to the present embodiment the conductive paste material portion 44 is placed in a partially cured state after the metal nanoparticle paste material is coated so as to cover the conductive paste material portion 44, the conductive paste material portion 44 may be placed in a partially cured state before the metal nanoparticle paste material is coated. When there is a possibility of these two materials blending, it is more preferable to partially cure the conductive paste material portion 44 before the metal nanoparticle paste material is coated, as it is thereby possible to reliably prevent mixing of the conductive paste material and the metal nanoparticle paste material.

Although according to the present embodiment the conductive paste material portion 44 is in a partially cured state when placing the electronic component 3 thereon, the conductive paste material portion 44 may be in a completely cured state, and the conductive paste material need not be in a partially cured state.

Although a conductive paste may be used with respect to which there is little difference between the curing temperature thereof and the curing temperature of the metal nanoparticle paste material, in such case it is not possible to cure only the conductive paste material after coating the metal nanoparticle paste material. Consequently, after coating the conductive paste material on the electrode 2a, it is necessary to cure the conductive paste material before applying the metal nanoparticle paste material. At this time, the conductive paste material may be placed in a partially cured state or in a completely cured state. However, from the point of view that damage to the electrode 21a can be reduced as much as possible, it is more preferable that the conductive paste material portion 44 is in a partially cured state when placing the electronic component thereon.

Although a case in which the electronic component 3 is an LED is described above, the present invention can also be applied to an electronic component with a larger electrode area. Further, although the bonding material that is a metal nanoparticle paste material is applied using an ink jet method, a method such as printing or the like may be used. Furthermore, the conductive paste may be a paste other than a silver paste.

The convex portion 43 of Embodiment 2 is not limited to the shape shown in FIGS. 10 and 11, and may be any of the various shapes described in Embodiment 1.

Embodiment 3

Hereunder, a mounting structure according to Embodiment 3 of the present invention is described.

Figure 13:
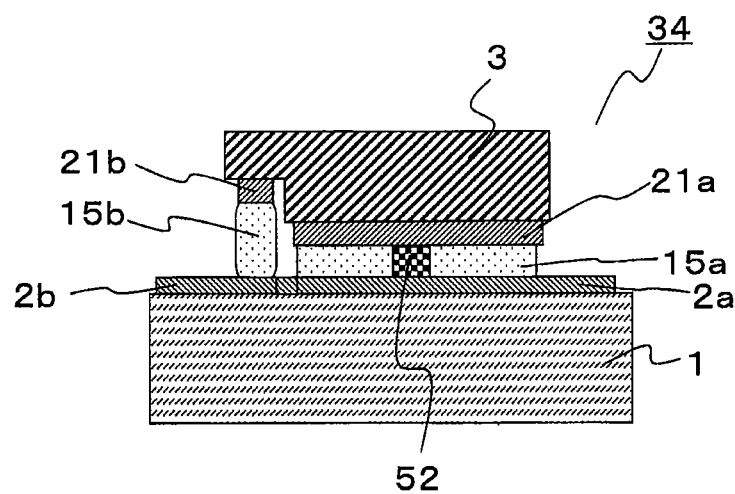
FIG. 13 is a cross-sectional configuration diagram of a mounting structure 34 according to Embodiment 3 of the present invention.

FIG. 13 is a cross-sectional configuration diagram of a mounting structure 34 according to Embodiment 3 of the present invention. As shown in FIG. 13, although the mounting structure 34 according to Embodiment 3 of the present invention has the same basic structure as in Embodiment 1, the material of the convex portion is different. The description of Embodiment 3 centers on this point of difference. In this connection, components that are substantially the same as components in Embodiment 1 are denoted by the same reference numbers.

A convex portion 52 according to Embodiment 3 is produced using a material including an oxide, and is used as an oxygen-supplying material. The convex portion 52 corresponds to one example of a "member that has supplied oxygen" of the present invention. Copper oxide, aluminum oxide or the like can be used as the oxide. The convex portion can be formed using a paste material in which copper oxide or aluminum oxide powder that has a particle diameter of approximately 1 μm is mixed with an epoxy resin. The composition of the paste material can be such that, for example, the ratio of percentage by weight of oxide to resin is 80:20.

Next, the method of manufacturing the mounting structure 34 of Embodiment 3 is described.

FIGS. 14(a) to (f) are views for describing the method of manufacturing the mounting structure 34 of Embodiment 3.

As shown in FIG. 14(a), the above described paste material is coated on the upper portion of the electrode 2a to form an oxygen-supplying material portion 50. The material used as the paste material that is a mixture of an oxide and a resin as described above is a material (material with a high thermal conductivity) with a curing temperature that is equal to or less than the curing temperature of the metal nanoparticle paste material and which increases in temperature faster than the metal nanoparticle paste material after curing. Next, as shown in FIG. 14(b), the metal nanoparticle paste material is coated on the electrodes 2a and 2b so as to cover the oxygen-supplying material portion 50 and thereby form the bonding material portions 13a and 13b. This step of coating the metal nanoparticle paste material corresponds to an example of the coating step of the present invention.

Thereafter, as shown in FIG. 14(c), by heating the substrate 1 on which the bonding material portions 13a and 13b are formed at a temperature that is equal to or greater than the curing temperature of the paste material and less than the curing temperature of the metal nanoparticle paste material, only an oxygen-supplying material portion 50 cures to form an oxygen-supplying member 51. The step of coating and curing the paste material to form the oxygen-supplying member 51 corresponds to an example of a member forming step of the present invention.

Next, as shown in FIG. 14(d), the electronic component 3 is held with the mounting tool 16 and placed over the bonding material portions 13a and 13b. Subsequently, the electronic component 3 is pressed against the bonding material portions 13a and 13b until the electrode 21a abuts against the upper end of the oxygen-supplying member 51 (see FIG. 14(e)). This step corresponds to an example of the arrangement step of the present invention.

Finally, curing of the bonding material portions 13a and 13b is performed by heat treatment in a hot air circulating oven to form the joints 15a and 15b, and oxygen from the oxygen-supplying member 51 is also supplied to the metal nanoparticle paste material at the periphery thereof to form a convex portion 52 and thereby produce the mounting structure 34 shown in FIG. 14(f). This step corresponds to an example of the heat treatment step of the present invention.

Thus, according to the present embodiment, since an oxide is used as a material for producing the convex portion 52, when performing the heat treatment step the oxygen of the oxide contributes to decomposition of the dispersing agent that is present in the bonding material portion 13a, and gasification of the metal nanoparticle paste material around the periphery of the convex portion 52 that is formed using a material including an oxide can be promoted. As described above, the metal nanoparticle paste material is stabilized by a dispersing agent so that the metal nanoparticles do not polymerize, and polymerization is inhibited by the dispersing agent covering the metal nanoparticles. In the present embodiment, an oxide used in a material for producing the convex portion 52 decomposes the dispersing agent and enables the efficient generation and escape of gas.

More specifically, by disposing the convex portion 52 formed by a material including an oxide at the central portion 70 of the bonding material, sintering of the metal nanoparticle paste material of the central portion 70 can be promoted, and although curing starts from the central portion 70 of the bonding material portion 13a and gas is generated, because the peripheral portion 71 is not yet cured it is possible for the generated gas to escape to outside from inside the bonding material portion 13a.

In the mounting structure produced in this manner, since the convex portion is used as a spacer, a starting point of gas generation by heat transfer, as well as a starting point of gas generation by oxygen supply, gas generated inside the bonding material portion can be allowed to escape to outside more efficiently.

Although according to the present embodiment the convex portion 52 contacts with the electrode 2a and the electrode 21a, when using the convex portion 52 only as an oxygen-supplying material the convex portion 52 may be disposed at the center of the bonding material portion in a condition in which the convex portion 52 does not contact with the electrodes 2a and 21a.

Further, when using the convex portion 52 only as an oxygen-supplying material, it is not necessary for the paste material to be a material (material with a high thermal conductivity) that increases in temperature faster than the metal nanoparticle paste material.

Furthermore, when the oxygen-supplying member 51 is not being used as a spacer, after placing the electronic component 3 over the bonding material portions 13a and 13b, the paste material of the present embodiment may be cured at the same time as the bonding material portions 13a and 13b.

When the curing temperature of the paste material is not lower than the curing temperature of the metal nanoparticle paste material, after coating the paste material on the electrode, the paste material can be cured to form the convex portion 52 prior to applying the metal nanoparticle paste material. Thus, the convex portion 52 can be used as a spacer.

According to the present embodiment, although the oxygen-supplying material portion 50 is completely cured in FIG. 14(c), the oxygen-supplying material portion 50 may be in a partially cured state at the stage illustrated in FIG. 14(c). In this case, when using the convex portion as a starting point of gas generation by heat transfer, a material to be used for producing the oxygen-supplying material portion 50 is a material (material with a high thermal conductivity) for which at least a partial curing temperature is equal to or less than a curing temperature of the metal nanoparticle paste material, and which increases in temperature faster than the metal nanoparticle paste material after being partially cured.

The convex portion 52 of Embodiment 3 is not limited to this shape, and may be any of the various shapes described in Embodiment 1.

Although according to Embodiment 3 oxygen is supplied to the metal nanoparticle paste material at the central portion 70 at the time of a heat treatment by providing the oxygen-supplying member 51, a configuration may also be adopted so as to supply oxygen to the metal nanoparticle paste material at the central portion 70 by placing a portion of either of the electrode 2a and the electrode 21a that corresponds to the central portion 70 of the joint 15a in an oxidized state. However, as mentioned in Embodiments 1 and 2, it is more preferable to provide a convex portion that has at least one function among the functions of a spacer and a starting point of gas generation by heat transfer. In this connection, a portion of the electrode 2a that corresponds to the central portion 70, for example, corresponds to the portion 200a' shown in FIG. 9. Further, a portion of the electrode 21a that corresponds to the central portion 70, for example, corresponds to a portion facing the portion 200a' shown in FIG. 9.

Although the convex portion 43 formed by a conductive paste material is provided according to Embodiment 2, by using a metal oxide as a conductive material in the conductive paste material it is possible to also use the convex portion 43 as a starting point of gas generation by oxygen supply.

Further, although according to Embodiment 3 the convex portion 52 is produced using a paste material in which a copper oxide or aluminum oxide powder is mixed in a resin, a structure may also be adopted in which a metal oxide such as copper oxide or aluminum oxide powder is simply placed on the electrode 21a. In this case, the bonding material portion 13a is formed by placing the metal oxide on the electrode 21a, and thereafter applying the metal nanoparticle paste material from the top thereof.

Although according to the above described Embodiments 1 to 3, the mounting structure is inserted into a hot air circulating oven and the bonding material portions 13a and 13b are cured, curing of the bonding material portions 13a and 13b may also be performed by placing the mounting structure on a hot plate. At that time, heating from the side of the substrate 1 on which the convex portion is provided is more preferable because the temperature of the convex portion increases faster than the temperature of the bonding material portion 13a as the result of heat transfer from the substrate 1, and the convex portion functions as a starting point of gas generation by heat transfer.

Further, although according to the above described Embodiments 1 to 3, a convex portion is provided only at the joint 15a on the side of the electrode 2a that has a large area, a convex portion may also be formed at the joint 15b on the electrode 2b side.

Furthermore, ultrasonic vibrations, and not only heating, may be applied in order to cure the bonding material portions 13a and 13b.

Embodiment 4

A mounting structure according to Embodiment 4 of the present invention is described hereunder.

Although an LED is used as one example of the electronic component 3 in the foregoing Embodiments 1 to 3, according to Embodiment 4 an IGBT (insulated gate bipolar transistor) is used as the electronic component. In Embodiment 4, the basic structure and manufacturing method of a joint and a convex portion are the same as in Embodiment 1.

Figure 15:
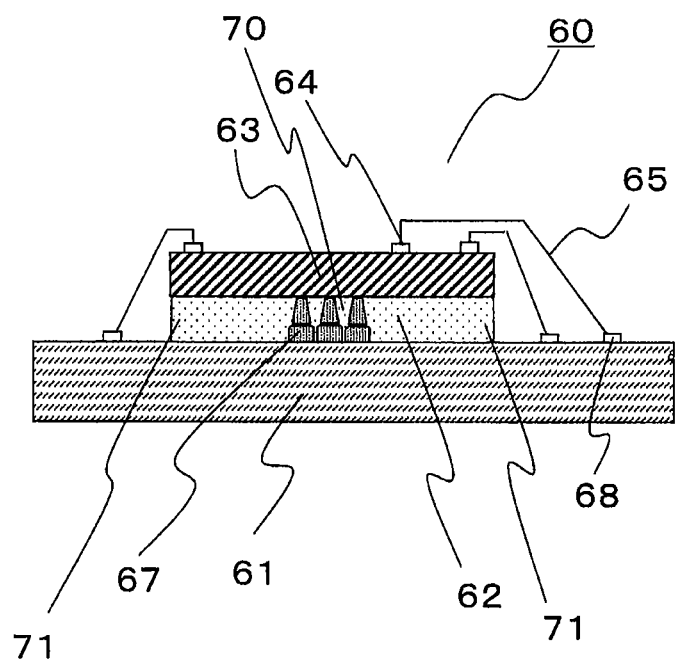
FIG. 15 is a cross-sectional configuration diagram of a mounting structure 60 according to Embodiment 4 of the present invention.

FIG. 15 is a cross-sectional configuration diagram of a mounting structure 60 according to Embodiment 4 of the present invention.

As shown in FIG. 15, the mounting structure 60 of Embodiment 4 includes a substrate 61 and an electronic component (IGBT) 63 that is arranged on the top side of the substrate 61 via a joint 62. The IGBT is used in a control system of a drive current to a driving device such as a motor, and is a semiconductor device for driving that requires a measure for heat radiation. An Si semiconductor may be mentioned as an example of a semiconductor used in an IGBT, and other examples include an SiC semiconductor and a GaN semiconductor.

An electrode 64 is formed on the upper surface of the electronic component 63. The electrode 64 is electrically connected to the substrate 61 by a metal wire 65.

The electronic component 63 is fixed on the substrate 61 by the joint 62 that is formed by the same metal nanoparticle paste material as in Embodiments 1 to 3. Heat radiation of the electronic component 63 is performed via the joint 62. A convex portion 67 that is the same as in Embodiment 1 is formed at a central portion 70 of the joint 62. Three convex portions 67 are provided at the central portion 70 of the joint 62. The upper edge of each convex portion 67 abuts against the electronic component 63. Thus, unlike Embodiments 1 to 3, according to Embodiment 4 the joint 62 is not provided between electrodes. In this connection, an example of a joint that has a heat radiation function of the present invention corresponds to the joint 62 of Embodiment 4, and an example of a member of the present invention corresponds to the convex portion 67 of Embodiment 4.

The mounting structure 60 of Embodiment 4 is manufactured as described below. First, similarly to Embodiment 1, the convex portions 67 are formed by metal bumps on the substrate 1, and a metal nanoparticle paste material is coated on the substrate 1 so as to cover the convex portions 67. Next, the electronic component 63 is placed on the metal nanoparticle paste material, and the electronic component 63 is pressed towards the substrate 1 until the electronic component 63 abuts against the convex portions 67. Thereafter, the metal nanoparticle paste material is cured by performing a heat treatment to form the joint 62 and fix the electronic component 63 to the substrate 1. Finally, the electrode 64 of the electronic component 63 and an electrode 68 of the substrate 61 are electrically connected by the metal wire 65 to thereby produce the mounting structure 60 of Embodiment 4.

In Embodiment 4 also, the convex portions 67 are used as spacers at the time of manufacture, and because gas generated at the central portion 70 can be allowed to escape to outside when performing a heat treatment, it is possible to prevent gas retention inside the joint 62. If a case is assumed in which gas remains inside the joint 62, the efficiency of heat radiation with respect to heat of the electronic component 63 being radiated to the substrate via the joint 62 will be poor. However, the heat radiation efficiency can be improved by suppressing gas retention as described in Embodiment 4.

Further, according to the present embodiment, since the convex portion 67 is formed by a metal bump that increases in temperature faster than the metal nanoparticle paste material, the convex portion 67 increases in temperature faster than the metal nanoparticle paste material at the time of a heat treatment. Consequently, when performing the heat treatment, curing of the metal nanoparticle paste material begins from the metal nanoparticle paste material that is positioned at the central portion 70 and that surrounds the convex portions 4, and gaseous matter such as a gas is generated accompanying the start of sintering, and the heat is gradually conveyed to the peripheral portion 71 from the central portion 70 and sintering and gas generation occur. Hence, it is possible to let the generated gas escape efficiently from the joint.

Further, by using a material including a metal oxide as a material for manufacturing the convex portion 67, the convex portion 67 may also be used as a starting point of gas generation by oxygen supply.

Embodiments 1 to 3 and the modification examples described in each embodiment can be applied to the mounting structure 60 of Embodiment 4. Below, inventions rerated to the present invention will be described.

The $1^{st}$ invention related to the present invention is a mounting structure, comprising:
a substrate;
an electronic component;
a joint which fixes the electronic component to a surface of the substrate, and which is made of a metal nanoparticle paste material; and
a member which is provided at a central portion of the joint, and which is made of a material with a higher thermal conductivity than the metal nanoparticle paste material.

Further, the $2^{nd}$ invention related to the present invention is a mounting structure, comprising:
a substrate;
an electronic component;
a joint which fixes the electronic component to a surface of the substrate, and which is formed of a metal nanoparticle paste material; and
a member which is provided at a central portion of the joint, and which has supplied oxygen.

The $3^{rd}$ invention related to the present invention is the mounting structure according to the $1^{st}$ or $2^{nd}$ invention, wherein the member is provided so as to abut against the substrate and so as not to abut against the electronic component.

Further, the $4^{th}$ invention related to the present invention is a method of manufacturing a mounting structure which comprises:
a substrate;
an electronic component;
a joint which fixes the electronic component to a surface of the substrate, and which is formed of a metal nanoparticle paste material; and
a member which is provided in the joint, and which is made of a material with a higher thermal conductivity than the metal nanoparticle paste material,
the method comprising:
a member forming step that forms the member on the substrate or the electronic component;
a coating step that coats the metal nanoparticle paste material on the substrate or the electronic component;
an arrangement step that arranges the substrate and the electronic component so that the member is arranged at a central portion of the metal nanoparticle paste material which is coated; and
a heat treatment step that cures the metal nanoparticle paste material by applying, after the arrangement step, heat to the metal nanoparticle paste material and the member, and that forms the joint, wherein
in the heat treatment step, a material of which the member is made increases in temperature faster than the metal nanoparticle paste material.

Further, the $5^{th}$ invention related to the present invention is a method of manufacturing a mounting structure which comprises:
a substrate;
an electronic component; and
a joint which fixes the electronic component to a surface of the substrate, and which is formed of a metal nanoparticle paste material,
the method comprising:
a member forming step that forms an oxygen-supplying member on the substrate or the electronic component;
a coating step that coats the metal nanoparticle paste material on the substrate or the electronic component;
an arrangement step that arranges the substrate and the electronic component so as to sandwich the metal nanoparticle paste material which is coated; and
a heat treatment step that allows oxygen to be supplied from the oxygen-supplying member to a central portion of the metal nanoparticle paste material which is coated, and cures the metal nanoparticle paste material, by applying, after the arrangement step, heat to the metal nanoparticle paste material and the oxygen-supplying member, and that forms the joint.

INDUSTRIAL APPLICABILITY

The mounting structure of the present invention and the method of manufacturing the mounting structure are advantageous in that gaseous matter that is generated when performing a heat treatment can be allowed to escape efficiently to outside, and the mounting structure is useful for bonding a semiconductor device to a substrate and the like.

DESCRIPTION OF SYMBOLS 1 substrate
2a, 2b electrode
3 electronic component
4 convex portion
13a, 13b bonding material portion
15a, 15b joint
16 mounting tool
21a, 21b electrode

The invention claimed is:
1. A mounting structure, comprising:
a substrate which has an electrode;
an electronic component which has an electrode;
a joint which is shaped like a square and connects the electrode of the electronic component and the electrode of the substrate, and which is made of a metal nanoparticle paste material; and
a plurality of convex portions which are provided within the metal nanoparticle paste material of the joint between the electrode of the electronic component and the electrode of the substrate, wherein
the plurality of convex portions are all provided at a central portion of the joint but are not provided at a peripheral portion of the joint such that the convex portions are closer to a center of the joint than they are to all edges of the joint, and are made of a material with a higher thermal conductivity compared with the metal nanoparticle paste material.

2. The mounting structure according to claim 1, wherein the convex portion is embedded at a central portion of the joint, and is made of a material with a higher thermal conductivity compared with the metal nanoparticle paste material.

3. The mounting structure according to claim 1, wherein the convex portion is a member which is embedded at a central portion of the joint, and which has supplied oxygen to the metal nanoparticle paste material.

4. The mounting structure according to claim 1, wherein the joint has a heat radiation function.

5. A mounting structure, comprising:
a substrate which has a plurality of electrodes;
an electronic component which has a plurality of electrodes;
a joint which connects one of the electrodes of the electronic component and one of the electrodes of the substrate, and which is made of a metal nanoparticle paste material; and
a plurality of convex portions, each convex portion provided within the metal nanoparticle paste material of the joint between the one of the electrodes of the electronic component and the one of the electrodes of the substrate, wherein
the plurality of convex portions are all positioned closer to a center of the joint than they are to all edges of the joint.

6. The mounting structure according to claim 1, wherein:
the electrode of the substrate and the electrode of the electronic component are provided so as to at least partly face each other; and
the joint is provided at least between portions of the electrodes, which are provided so as to face each other.

7. The mounting structure according to claim 1 or 2, wherein the convex portion is formed by a bump.

8. The mounting structure according to any of claims 1 to 3, wherein the convex portion is made using a paste material which includes a conductive substance.

9. The mounting structure according to claim 3, wherein the convex portion is made using a paste material in which a metal oxide and a resin are mixed.

10. The mounting structure according to claim 3, wherein the convex portion is made using a metal oxide.

11. The mounting structure according to any of claims 1 to 3, wherein the convex portion is made of a material with a lower curing temperature compared with the metal nanoparticle paste material of which the joint is made.

12. The mounting structure according to any of claims 1 to 3, wherein the metal nanoparticle paste material includes metal particles of less than 50 nm.

13. The mounting structure according to claim 1, wherein a portion of either the electrode of the substrate or the electrode of the electronic component, which corresponds to the central portion of the joint, is formed of a material which has supplied oxygen to the metal nanoparticle paste material.

14. The mounting structure according to claim 1, wherein the upper-part diameter of the convex portion is 20 to 30 μm, and the lower-part diameter of the convex portion is 50 to 80 μm.

15. The mounting structure according to claim 1, wherein the convex portion is provided at a central portion of the joint but is not provided at a peripheral portion of the joint.

16. The mounting structure accordingly to claim 14, wherein a plurality of the convex portions are embedded at a central portion of the joint.

17. A mounting structure, comprising:
a substrate which has a first electrode, and a second electrode that has an area larger than an area of the first electrode;
an electronic component which has a third electrode, and a fourth electrode that has an area larger than an area of the third electrode;
a first joint which connects the second electrode and the fourth electrode, and which is made of a metal nanoparticle paste material;
a second joint which connects the first electrode and the third electrode, and which is made of the metal nanoparticle paste material;
a plurality of convex portions which are provided within the first joint between the second electrode and the fourth electrode, wherein
there is no convex portion provided within the second joint between the first electrode and the third electrode, and
the plurality of convex portions are all provided at a central portion of the first joint but are not provided at a peripheral portion of the first joint such that the convex portions are closer to a center of the first joint than they are to all edges of the first joint, and are made of a material with a higher thermal conductivity compared with the metal nanoparticle paste material.

18. The mounting structure according to claim 17, wherein:
the second electrode is larger than the fourth electrode; and
the first electrode is larger than the third electrode.

19. The mounting structure according to claim 17, wherein a distance between the second electrode and the fourth electrode is smaller than a distance between the first electrode and the third electrode.

20. The mounting structure according to claim 1, wherein the joint connects the electrode of the electronic component and the electrode of the substrate, but does not connect another electrode of the electronic component and another electrode of the substrate.

* * * * *